US010680130B2

United States Patent
Moktadir et al.

(10) Patent No.: US 10,680,130 B2
(45) Date of Patent: Jun. 9, 2020

(54) ON-CHIP INTEGRATION OF MMIC AND SINGLE PHOTON DETECTORS

(71) Applicant: Kabushiki Kaisha Toshiba, Minato-ku (JP)

(72) Inventors: Zakaria Moktadir, Cambridge (GB); Andrew Sharpe, Cambridge (GB); Andrew James Shields, Cambridge (GB)

(73) Assignee: Kabushiki Kaisha Toshiba, Minato-ku (JP)

( * ) Notice: Subject to any disclaimer, the term of this patent is extended or adjusted under 35 U.S.C. 154(b) by 170 days.

(21) Appl. No.: 15/903,537

(22) Filed: Feb. 23, 2018

(65) Prior Publication Data
US 2018/0261712 A1 Sep. 13, 2018

(30) Foreign Application Priority Data
Mar. 10, 2017 (GB) .................................. 1703860.5

(51) Int. Cl.
*H01L 31/107* (2006.01)
*H01L 27/146* (2006.01)
(Continued)

(52) U.S. Cl.
CPC ...... *H01L 31/107* (2013.01); *H01L 27/14609* (2013.01); *H01L 31/02027* (2013.01); *H01L 31/03046* (2013.01)

(58) Field of Classification Search
CPC ............. H01L 31/107; H01L 31/02027; G01J 2001/442; G01J 2001/4466
See application file for complete search history.

(56) References Cited

U.S. PATENT DOCUMENTS

| 4,891,519 A | 1/1990 | Nohira et al. |
| 5,362,960 A | 11/1994 | Komatsu et al. |

(Continued)

FOREIGN PATENT DOCUMENTS

| GB | 2485400 | 5/2012 |
| JP | 58-63243 A | 4/1983 |

(Continued)

OTHER PUBLICATIONS

British Examination Search Report dated Aug. 16, 2017 in British application GB 1703860.5, filed on Mar. 10, 2017.
(Continued)

*Primary Examiner* — Thanh Luu
(74) *Attorney, Agent, or Firm* — Oblon, McClelland, Maier & Neustadt, L.L.P.

(57) ABSTRACT

A photon detection device and method of fabricating a photon detection device are provided. The photon detection device comprises a first input terminal for receiving a DC input voltage, a second input terminal for receiving an AC input voltage and a bias tee connected to the first and second input terminals and configured to combine the AC and DC input voltages to form a combined voltage on an output of the bias tee. A first single photon detector is connected to the output of the bias tee and configured to receive the combined voltage from the bias tee, register a detection signal based on only a single photon being incident on the first single photon detector and output the detection signal indicative of the detected photon. A first output terminal is connected to an output of the first single photon detector for outputting the detection signal. The photon detection device is formed in a single integrated circuit.

5 Claims, 17 Drawing Sheets

(51) Int. Cl.
*H01L 31/02* (2006.01)
*H01L 31/0304* (2006.01)

(56) References Cited

U.S. PATENT DOCUMENTS

| | | |
|---|---|---|
| 2004/0159776 A1 | 8/2004 | Richard et al. |
| 2010/0253616 A1 | 10/2010 | Omi et al. |
| 2011/0199349 A1 | 8/2011 | Katoh |
| 2013/0214134 A1* | 8/2013 | Thomas .................. G01J 1/46 250/214 R |
| 2013/0334434 A1 | 12/2013 | Nyman et al. |
| 2014/0191115 A1 | 7/2014 | Webster et al. |
| 2016/0091617 A1* | 3/2016 | Bouzid .................. H04L 9/00 250/371 |

FOREIGN PATENT DOCUMENTS

| | | |
|---|---|---|
| JP | 2-284477 | 11/1990 |
| JP | 5-211781 A | 8/1993 |
| JP | 9-213988 A | 8/1997 |
| JP | 2009-177150 A | 8/2009 |
| JP | 2009-238935 A | 10/2009 |
| JP | 2013-201309 A | 10/2013 |
| WO | WO 2013/002430 A1 | 1/2013 |

OTHER PUBLICATIONS

Carmelo Scarcella et al., "InGaAs/InP Single-Photon Detector Gated at 1.3 GHz With 1.5% Afterpulsing," IEEE Journal of Selected Topics in Quantum Electronics, vol. 21, No. 3, 2015, pp. 6.

Office Action dated May 28, 2019 in Japanese Patent Application No. 2018-020881.

Japanese Office Action dated Feb. 5, 2019 in Japanese Patent Application No. 2018-020881 (submitting unedited computer generated English translation only), 4 pages.

* cited by examiner

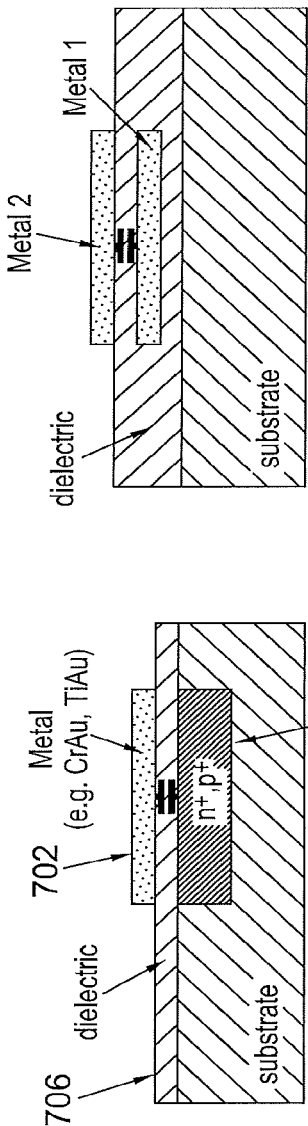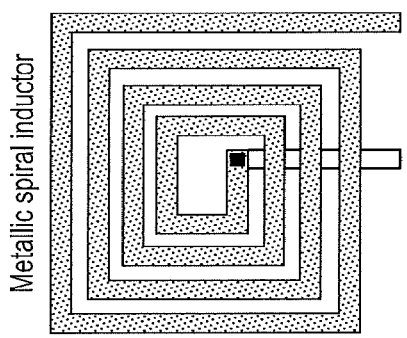
Figure 7A
Figure 7B
Figure 7C

ON-CHIP INTEGRATION OF MMIC AND SINGLE PHOTON DETECTORS

TECHNICAL FIELD

The present disclosure relates to photon detection devices and methods of manufacturing photon detection devices.

BACKGROUND

Photon detectors are used in a number of applications including industrial inspection, environmental monitoring, testing of fibre optic cables and components, medical imaging, chemical analysis and scientific research.

Photon detectors are also important for many applications in quantum information technology, such as linear optics quantum computing, quantum relays and repeaters, quantum cryptography, photon number state generation and conditioning, and characterisation of photon emission statistics of light sources.

There is a continuing need to improve the photon detectors used in these applications.

BRIEF DESCRIPTION OF THE DRAWINGS

Arrangements of the present invention will be understood and appreciated more fully from the following detailed description, made by way of example only and taken in conjunction with drawings in which:

FIG. 7A shows an on-chip capacitor;

FIG. 7B shows an alternative on-chip capacitor;

FIG. 7C shows a metallic spiral inductor suitable for on-chip implementation;

DETAILED DESCRIPTION

Figure 1:
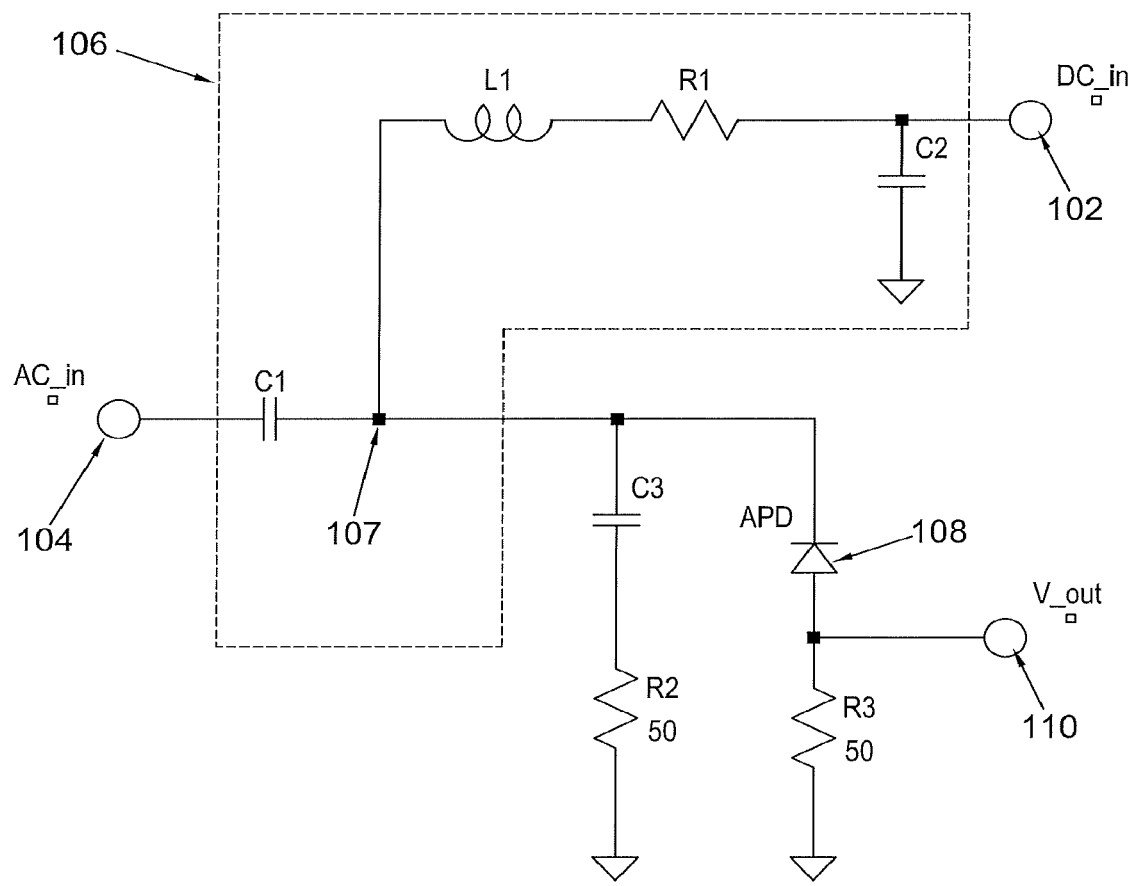
FIG. 1 shows an integrated circuit schematic for a single photon detector according to a first arrangement.

According to a first arrangement there is provided a photon detection device comprising a first input terminal for receiving a DC input voltage, a second input terminal for receiving an AC input voltage and a bias tee connected to the first and second input terminals and configured to combine the AC and DC input voltages to form a combined voltage on an output of the bias tee. A first single photon detector is connected to the output of the bias tee and configured to receive the combined voltage from the bias tee, register a detection signal based on only a single photon being incident on the first single photon detector and output the detection signal indicative of the detected photon. A first output terminal is connected to an output of the first single photon detector for outputting the detection signal. The photon detection device is formed in a single integrated circuit.

By forming the photon detection device on a single chip, in a single integrated circuit, the size of the photon detection device can be greatly reduced compared to systems that have an external bias tee. In addition, by implementing the device in a single integrated circuit, the distance between components and the size of components can be reduced to reduce the noise in the system and increase the speed. This is particularly important in single photon detection systems where the detection signals may be quite small compared to the capacitive response of the single photon detector(s) and which can operate at GHz frequencies.

A single photon detection device is able to detect light based on only one photon. This is useful in, for instance, quantum cryptography.

The output of the single photon detector may be measured over a resistor. The first single photon detector may be connected on a first line between the output of the bias tee and ground, the first line comprising the first single photon detector connected in series to a resistor, wherein the output terminal is connected between the first single photon detector and the resistor. Connected to ground could include being connected to a terminal configured to be connected to ground, or being connected directly to ground.

Advantageously, the bias tee comprises a first input line connected to the first input terminal, the first input line comprising a low pass filter, and a second input line connected to the second input terminal, the second input line comprising a high pass filter.

The bias tee is able to apply a low pass filter to the DC input voltage and a high pass filter to the AC input voltage to filter out unwanted DC/AC components. The bias tee can therefore combine clean AC and DC signals to form the combined voltage provided to the first single photon detector. By implementing the high and low pass filters in the integrated circuit with the single photon detector, the distance that the filtered signal has to travel is reduced, thereby reducing the noise that may be introduced into the bias voltage provided to the first single photon detector. In addition, reducing this distance and reducing the size of the components reduces the capacitive response of the circuit and therefore allows the circuit to be driven at a higher speed, increasing the maximum gating speed for the system.

Advantageously, the first and second input lines may combine at a node, and wherein a connection between the node and the first single photon detector is less than 200 µm long.

In one arrangement the low pass filter comprises an inductor and a resistor and/or the high pass filter comprises a capacitor. The inductor and resistor may be connected in series.

Advantageously, the low pass filter may further comprise a second capacitor connected in parallel to the inductor and resistor. The second capacitor may connect the first input terminal to ground. This may be used for additional low pass filtering.

According to an arrangement a capacitive line for impedance matching is connected between the output of the bias tee and ground, in parallel to the first single photon detector. This allows the impedance within the system to be balanced to maximize the power transfer or minimize signal reflection from the load. The capacitive line may comprise a third capacitor connected in series to a second resistor.

The first single photon detector may be a single photon avalanche detector.

According to a further arrangement the photon detection device further comprises a second single photon detector connected to the output of the bias tee, in parallel to the first single photon detector, and configured to receive the combined voltage from the bias tee and output an output signal, and a second output terminal connected to an output of the second single photon detector for outputting the output signal.

This allows the capacitive response of one of second single photon detector to be used to cancel the capacitive response of the first single photon detector to help to isolate signals from the detection of single photons more effectively. Advantageously, the first and second single photon detectors may be located adjacent to each other, for instance, within 150 μm of each other, so that they experience similar electric fields. This helps to ensure that the second single photon detector has a similar capacitive response to the first single photon detector.

Whilst the above discussion relates to cancelling signals from the first single photon detector using the second single photon detector, the reverse may apply, wherein the signals from the first single photon detector are subtracted from the signal from the second single photon detector.

The second single photon detector may be a single photon avalanche detector.

Advantageously, the second single photon detector may be identical to the first single photon detector. This helps to match the capacitive responses of the two single photon detectors, so that one may act as a dummy single photon detector for noise cancellation.

Both the first and second single photon detectors may be single photon avalanche detectors. The two single photon detectors may have the same layer structure and doping. Having said this, the second single photon detector may have a capping layer formed over it to block photons. This ensures that only the capacitive response is output, and no signals caused by photons are output, so that it always acts as a dummy single photon detector.

The first and second single photon detectors may have been formed simultaneously. For instance, the two single photon detectors may have been formed sharing the same deposition and/or doping steps. This can help match the capacitive response of the two single photon detectors by reducing fabrication differences between the two.

Advantageously, the photon detection device may be further configured to block photons incident on the second single photon detector. This ensures that the output signal of the second photon detector does not include detection signals so that only the capacitive response is output. This may be in the form of a capping layer deposited over the single photon detector to block photons. Alternatively, a removable cap may be used (for instance, a slider or a cap that may be placed over the second single photon detector). The first single photon detector may identical to the second single photon detector beneath any capping layer/cap.

The first and second single photon detectors may be located within 150 μm of each other. This can help reduce fabrication differences and ensure similar local electric fields (that would affect the noise) are applied to the two single photon detectors. Optionally, the first and second single photon detectors may be located within 50 μm or 20 μm of each other.

According to an arrangement there is provided a photon detection system comprising a photon detection device as described herein and a noise cancellation circuit configured to subtract the output signal from the detection signal to remove noise from the detection signal. The noise cancellation circuit may be external to the integrated circuit (the photon detection device) and connected via terminal(s) in the integrated circuit. The noise cancellation circuit may be a self-differencing circuit (where one single photon detector is used) or a subtraction circuit (where two single photon detection circuits are used).

According to an arrangement the single photon detection system comprises a photon detection device as described herein, or a photon detection system as described above, and a single photon source configured to direct only one photon at a time to the first single photon detector, wherein the single photon detection system is configured to not direct light towards the second single photon detector. Accordingly, whilst the system or device may be configured to block light to one of the single photon detectors, in an alternative arrangement, both detectors are exposed and able to detect photons, but only one is utilised to detect light at one time so that the other may be used to cancel out the capacitive response.

According to a further arrangement there is provided a method for fabricating a photon detection device on a substrate, the method comprising: forming a first single photon detector on the substrate, wherein the first single photon detector is configured to register a detection signal based on only a single photon being incident on the first single photon detector and output the detection signal indicative of the detected photon; forming a bias tee on the substrate, the bias tee being configured to combine AC and DC input voltages to form a combined voltage on an output of the bias tee, the output of the bias tee being connected to the first single photon detector to provide the combined voltage to the first single photon detector; forming on the substrate a first input terminal for receiving the DC input voltage, the first input terminal being connected to the bias tee to provide the DC input voltage to the bias tee; forming on the substrate a second input terminal for receiving the AC input voltage, the second input terminal being connected to the bias tee to provide the AC input voltage to the bias tee; and forming on the substrate a first output terminal connected to an output of the first single photon detector for outputting the detection signal, wherein the photon detection device is formed in a single integrated circuit.

Forming the photon detection device on a single substrate in a single integrated circuit reduces the size of the system, reduces the noise in the system and allows the system to operate at a faster speed.

The method may further comprise forming on the substrate a second single photon detector connected to the output of the bias tee, in parallel to the first single photon detector, and configured to receive the combined voltage from the bias tee and output an output signal and forming on the substrate a second output terminal connected to an output of the second single photon detector for outputting the output signal.

The second single photon detector may act as a dummy single photon detector to cancel out the capacitive response from the first single photon detector.

The first and second single photon detectors may be identical. In one arrangement the first and second single photon detectors are formed simultaneously. This allows the same materials and dopants to be utilised and reduces the fabrication differences between the two detectors.

According to a further arrangement the first and second single photon detectors are formed within 150 μm of each other.

Single photon avalanche detectors (SPADs) are highly sensitive photodetectors that are able to detect individual photons. SPADs utilise avalanche breakdown to amplify the current caused by individual photons hitting the detector.

As SPADs need to detect very small signals, a high degree of precision and noise cancellation is required. Measurement error can be reduced by gating the SPAD, where the SPAD is only turned on during the time that a photon is expected to be received. Having said this, the speed of gating can be limited by the speed and precision of signals travelling through the system. In addition SPADs systems can be quite large.

There is therefore a need for a faster and more precise single photon detector that can be implemented in a smaller system.

Arrangements described herein incorporate driving circuitry onto the same chip as single photon detector(s). This reduces the distance that signals need to travel, thereby reducing error and increasing the speed in the system.

FIG. 1 shows an integrated circuit schematic for a single photon detector according to a first arrangement. The components shown are implemented on as an integrated circuit on a single chip.

Two input signals are received. A direct current (DC) signal is received at a DC input 102 and an alternating current (AC) signal is received at an AC input 104. The two signals are combined at a bias tee 106 which supplies the combined signal to an input of the avalanche photon detector (APD) 108. The bias voltage applied to the APD thus comprises both a DC component and an AC component.

The bias voltage applied to the APD is above the breakdown voltage at its highest values and below the breakdown voltage at its lowest values. When the bias voltage exceeds the breakdown voltage the detector is gated "on" and is able to detect individual photons incident on a detection region of the APD 108. When the voltage is below the breakdown voltage the detector is gated "off" and the detector is insensitive to photons. The frequency of the AC voltage component is thus the gating frequency. The gating frequency may be synchronised with the driving frequency of the photon source in a QKD system for example.

Depending on the operation temperature and the device structure, the breakdown voltage for APDs can vary from 20 to 300 V.

The AC signal is a voltage that oscillates at the gating frequency of the device. The DC signal is a steady bias voltage that is adjustable below or above the breakdown voltage of the APD 108.

The DC input 102 and AC input 104 are connected to first and second arms of the bias tee 106 respectively. The bias tee circuit 106 is connected to a cathode contact of the APD 108 (however, the APD may be reversed, so that the bias tee circuit 106 is connected to the anode, provided that the bias voltage is reversed). The bias tee 106 comprises, on a first arm of the tee, an inductor L1 and resistor R1 connected in series to the DC input 102, and on a second arm of the tee, a first capacitor C1 connected to the AC input 104. The inductor L1 and the first resistor R1 act as a low pass filter for the DC signal.

The first arm further comprises a second capacitor C2 connecting the DC input 102 to ground. The second capacitor works to provide additional low-pass filtering to the first arm of the bias tee 106.

In an alternative arrangement, the second capacitor C2 is not utilised. Instead, the inductor L1 and first resistor R1 can act as a low pass filter without being connected in parallel to the second capacitor C2.

The second arm of the bias tee comprises a first capacitor C1. The first capacitor C1 acts as a high pass filter for the AC signal. The first and second arms join at a node 107 (to combine the filtered AC and DC inputs) and continue on via an output line of the bias tee 106.

A third capacitor C3 is connected to the output of the bias tee 106 in parallel to the APD 108. The third capacitor C3 is connected to ground via a second resistor R2. This allows the circuit to be tuned for impedance matching.

An output of the APD 108 is also connected to ground via a third resistor R3. The output of the APD 108 is connected to an output terminal 110 of the circuit. This provides an output voltage ($V_{out}$) that can be filtered to remove noise to allow signals from individual photons to be detected. For instance, the output voltage $V_{out}$ may be input into a self-differencing circuit to cancel the capacitive response of the APD 108 and to leave only the avalanche signal arising from photon detection. In a self-differencing mode of operation, the background of the output signal is removed by comparing a part of the signal with an earlier part of the signal that is phase shifted by 180 degrees.

In a further arrangement, the (filtered) output voltage is input into a discriminator configured to compare the measurement of the avalanche event with a predetermined level. This provides a digital output when an avalanche event is detected.

The circuit of FIG. 1 is implemented on a single chip (in a single integrated circuit). This reduces the size of the detection system in general and reduces the distance that the input signals need to travel to drive the APD 108. This therefore reduces the amount of noise in the system (e.g. by reducing inductive and capacitive coupling in the driving circuit) compared to systems with external driving circuitry. This is in contrast to external driving circuitry which would have to be connected to the APD via long wires (e.g. more than 1 m long) which can be subject to a relatively large amount of noise.

In addition, reducing the distance that the signals need to travel allows the circuit to function more quickly by reducing the amount of parasitic inductance and capacitance within the system. The APD can therefore be driven at a faster clock frequency. This means that the system can achieve gating at frequencies higher than 2 GHz.

The capacitance, resistance and inductance of the various components of the circuit may be adapted to tune the system. For instance, whilst FIG. 1 states that the second R2 and third R3 resisters have resistances of 50Ω each, alternative resistances may be used based on the system at hand provided that R2 and R3 have equal resistances for impedance matching.

To help further reduce background response, a second ("dummy") APD may be used. The dummy APD is not used to detect light, but simply to act as a basis for cancelling noise from the output signal of the first APD 108.

Figure 2:
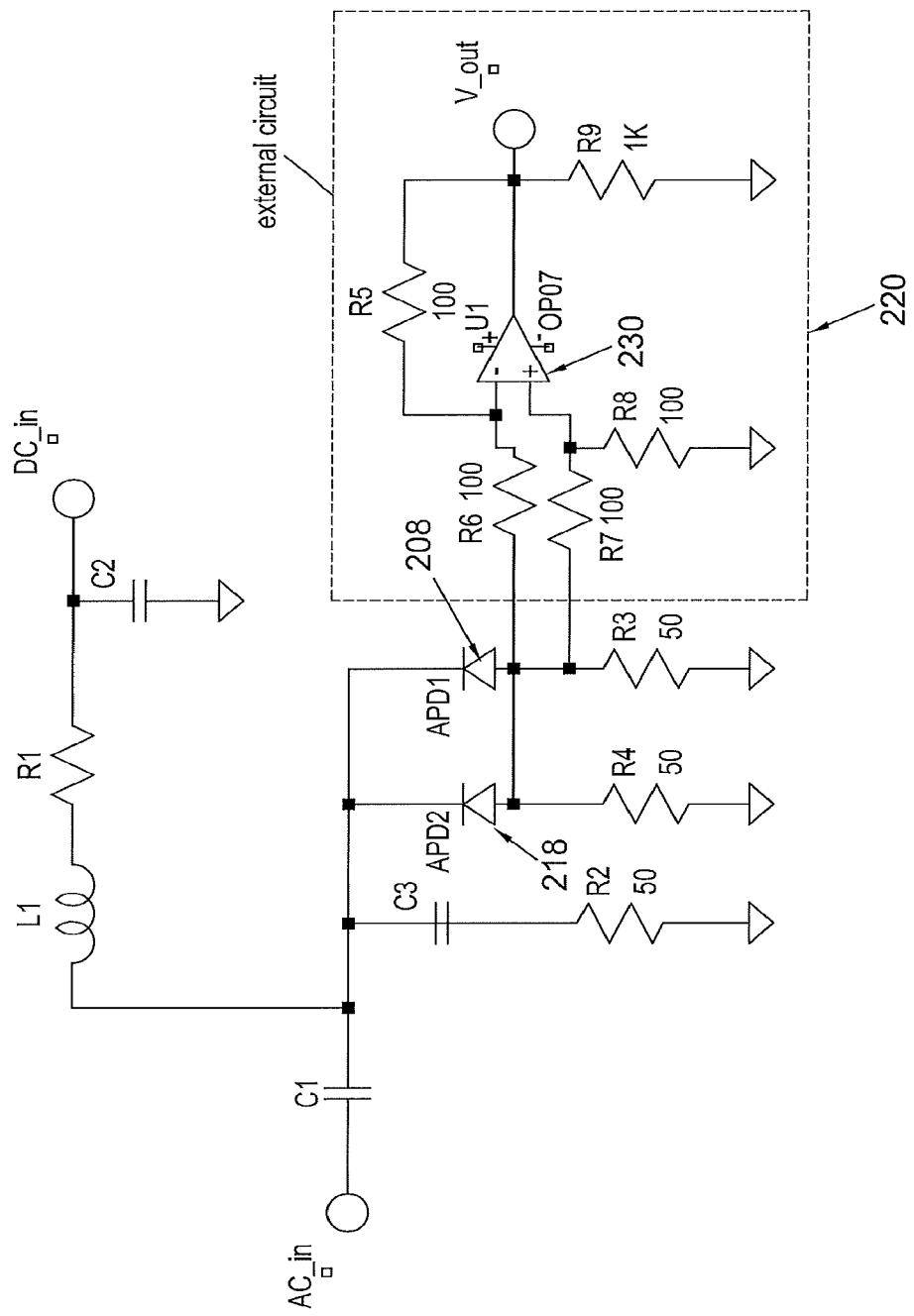
FIG. 2 shows an integrated circuit schematic for a single photon detector with a differential output for capacitive response cancellation according to an arrangement.

FIG. 2 shows an integrated circuit schematic for a single photon detector with a differential output for capacitive response cancellation according to an arrangement.

The circuit is similar to that of FIG. 1; however, a dummy APD (APD1) 218 is utilised in parallel to a first APD (APD) 208. The first APD 208 acts to detect photons in the same manner as APD 108. The dummy APD 218 does not detect photons. This may be because no photons are shone on the dummy APD 218, or may be due to the dummy APD 218 being covered to prevent light reaching its detection region.

The input of the dummy APD 218 is connected to the output of a bias tee (similar to bias tee 106), in parallel to the first APD 208. The output of the dummy APD 218 is connected to ground via a fourth resistor R4 in a similar arrangement to the first APD 208 and the third resistor R3.

The outputs of the dummy APD 218 and the first APD 208 may be connected to a differential amplifier 220. This subtracts the signal from the dummy APD 218 from the signal from the first APD 208 to remove the background response of the first APD 208 from the signal and isolate avalanche pulses caused by detected photons.

The differential amplifier 220 comprises an operational amplifier 230. The operational amplifier 230 comprises an inverting input (labelled "−") and a non-inverting input (labelled "+"). An output of the operational amplifier 230 is connected to the inverting input via a fifth resistor R5. The output of the dummy APD 218 is connected, via a sixth resistor R6, to the inverting input. The output of the first APD 208 is connected, via a seventh resistor R7, to the non-inverting input. The non-inverting input is connected to ground via an eighth resistor, R8. The output of the operational amplifier 230 is connected to ground via a ninth resistor R9. The output of the operational amplifier is also connected to an output node PR2 for outputting the noise cancelled signal (e.g. to a comparator to provide a digital output).

The resistor values of the arrangement of FIG. 2 are detailed in Table 1. Having said this, alternative resistances may be used, depending on the characteristics of the system.

TABLE 1 resistance values for the arrangement of FIG. 2.

| Resistor | Resistance |
| --- | --- |
| R1 | 100 Ω |
| R2 | 50 Ω |
| R3 | 50 Ω |
| R4 | 50 Ω |
| R5 | 100 Ω |
| R6 | 100 Ω |
| R7 | 100 Ω |
| R8 | 100 Ω |
| R9 | 1 kΩ |

The first APD 208 and the dummy APD 218 are substantially identical. This means that the capacitive response of the dummy APD 218 can be considered substantially the same as the capacitive response of the first APD 208. This is particularly the case if the dummy APD 218 is located in close proximity to the first APD 208 (for instance, within 20 µm). This means that the dummy APD 218 and the first APD 208 will be subject to similar electrical fields, thereby having similar capacitive responses.

The dummy APD 218 is identical to the first APD 208 in that it is of the same construction (e.g. having the same doping levels and layer thicknesses). This means that the dummy APD 218 and the first APD 208 have the same breakdown voltage. The resistance of the third R3 and fourth R4 resistors is the same (in this case, 50Ω) and the first APD 208 and the dummy APD 218 receive the same bias voltage from the bias tee. This means that the two APDs will have substantially the same electrical response and output substantially the same signals with the exception that the output of the first APD 208 includes voltage spikes caused by the detection of individual photons.

As the dummy APD 218 and the first APD 208 are located on the same chip and at close proximity, there will be fewer fabrication differences than if the APDs were fabricated separately. This is because, by fabricating the APDs on the same chip and at close proximity, the crystal structure of the layers of the two APDs will likely be identical. In addition, the two APDs can be fabricated at the same time, sharing the same doping and deposition steps. The doping of the layers will therefore also likely be identical. Accordingly, by fabricating the two APDs on the same chip, at close proximity and at the same time, the dummy APD 218 will be a better surrogate for the first APD 208 and will therefore provide improved background cancellation.

In addition, by keeping the APDs on the same chip, the distance between the APDs can be reduced, thereby reducing the noise caused by signals travelling long distances, and reducing the difference in phase between the signals output from the two APDs (thereby improving the background cancellation when the two signals are subtracted).

The differential amplifier 220 acts as a subtractor. There is no need to implement the differential amplifier 220 on the chip. Instead, the differential amplifier 220 may be a circuit external to the circuit on the chip. The differential amplifier 220 may be connected to the on-chip circuit via output terminals connected to the outputs of the two APDs, similar to the output terminal 110 in FIG. 1. Equally, the sections labelled "GND" in FIGS. 1 and 2 need not be always connected to ground, but could simply represent terminals that can be connected to ground when the device is in use.

Figure 3:
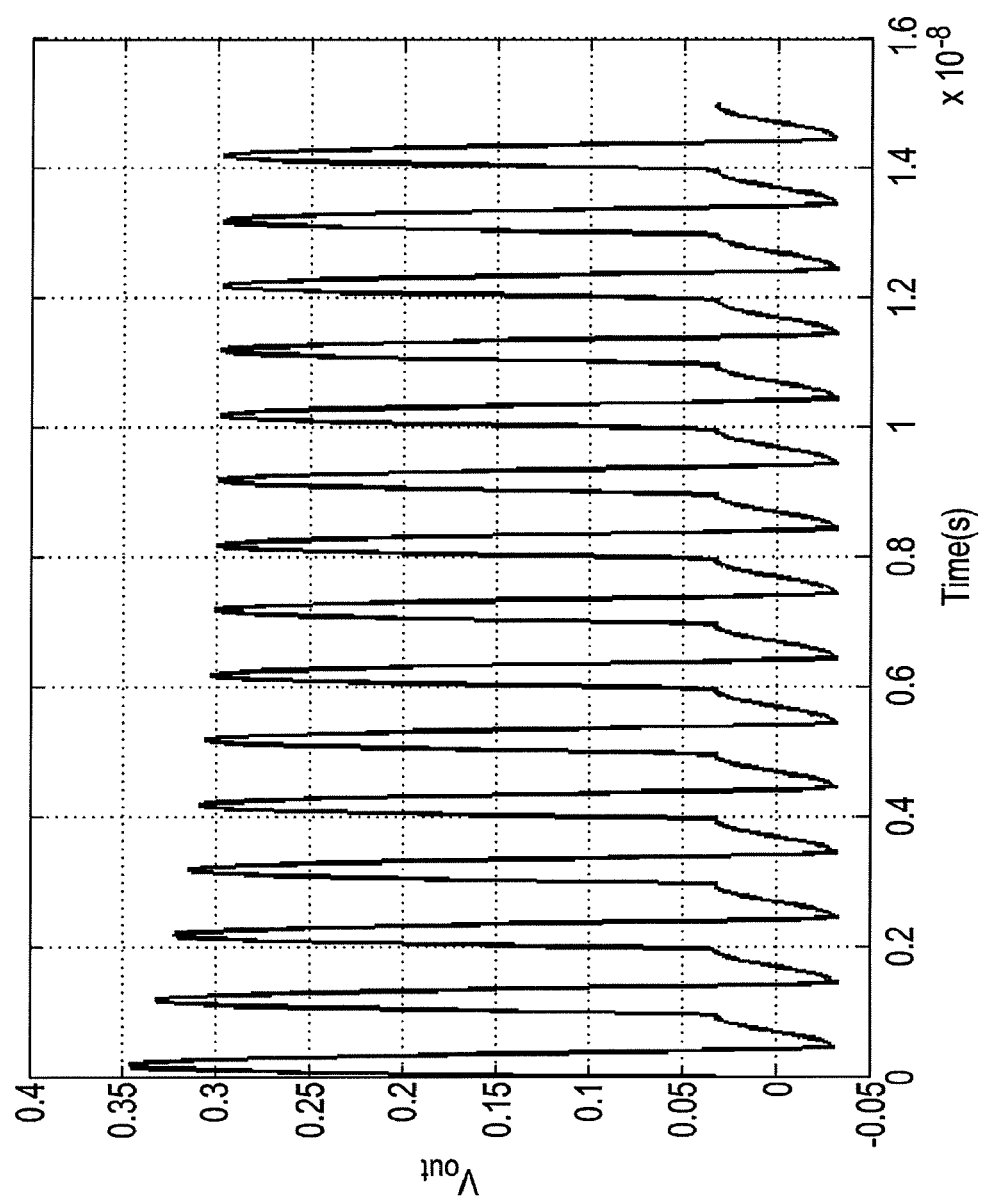
FIG. 3 shows a simulation of the voltage output for the circuit of FIG. 1.

FIG. 3 shows a simulation of the voltage output for the circuit of FIG. 1. The noise caused by the capacitive response of the system may be removed using a self-differencing circuit.

Figure 4:
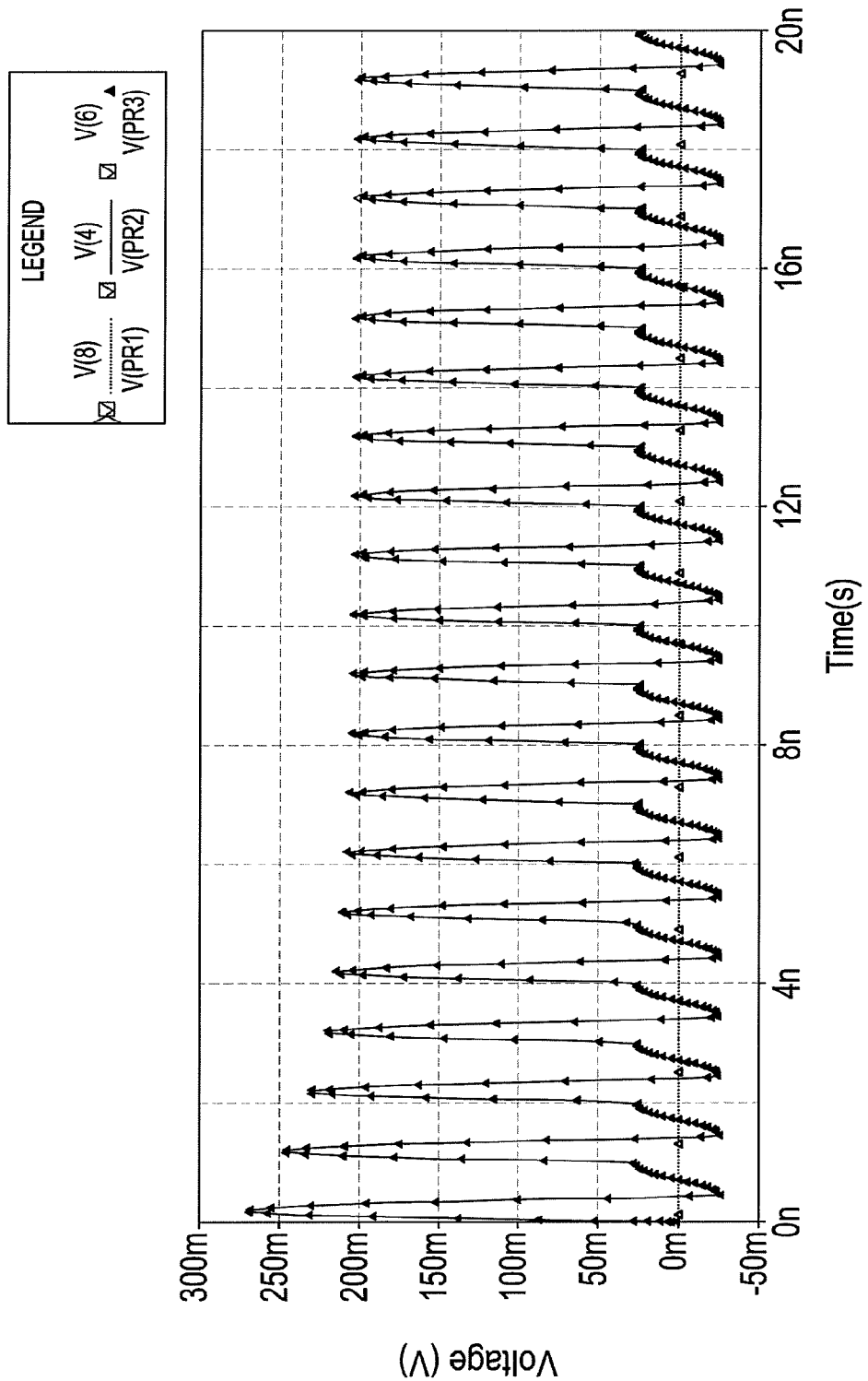
FIG. 4 shows a simulation of the voltage output at each APD and the output voltage of the subtractor from FIG. 2.

FIG. 4 shows a simulation of the voltage output at each APD and the output voltage of the subtractor from FIG. 2. The output of the first APD 208 is depicted via a smooth line, the output of the dummy APD 218 is depicted via a series of triangles and the output of the differential amplifier 220 (the subtractor) is depicted via a dotted line with hollow triangles. In the present arrangement, neither APD is detecting photons. Accordingly, the signals relate solely to the background noise of the system.

Figure 5:
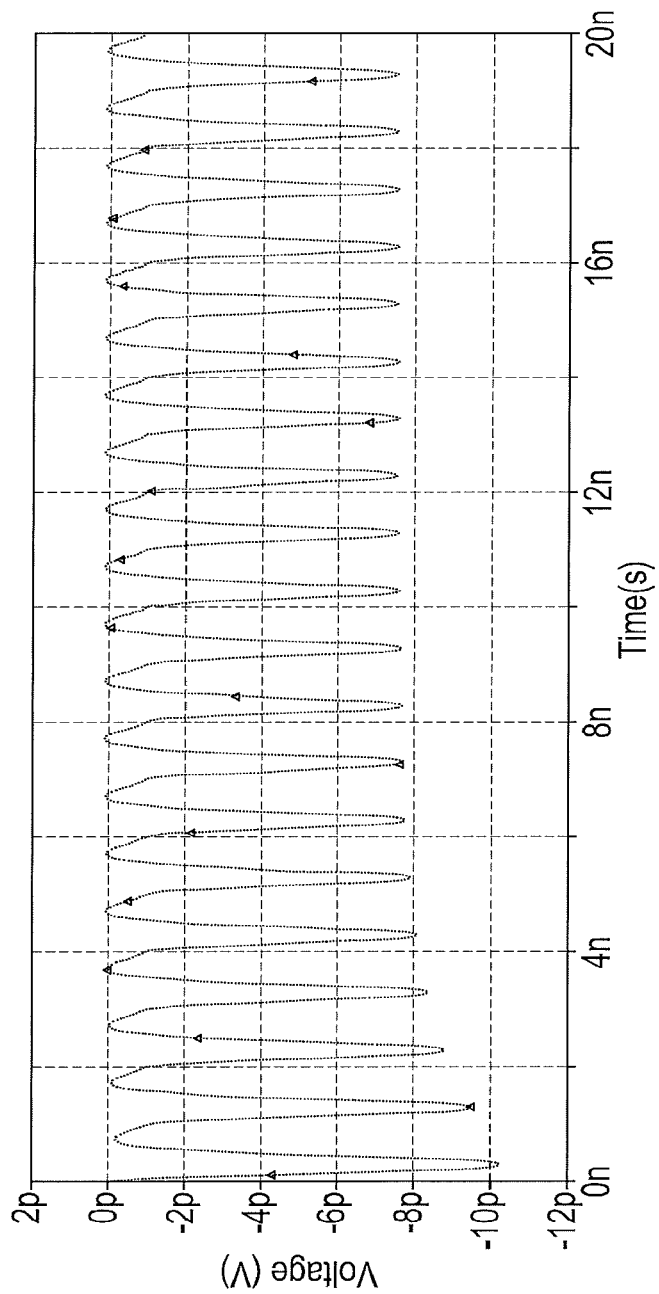
FIG. 5 shows a simulation of the output voltage of the subtractor from FIG. 2 on a pico-volt (pV) scale.

FIG. 5 shows a simulation of the output voltage of the subtractor from FIG. 2 on a pico-volt (pV) scale. The outputs of the two APDs are substantially the same. Accordingly, when the output of the dummy APD 218 is subtracted from the output of the first APD 208, most of the voltage fluctuations are removed. This effectively cancels out the capacitive response of the first APD, and brings the background noise down to the region of a few pico-volts. The reduced noise allows photon detection signals to be detected more effectively. This is particularly the case given that the avalanche signal produced by a detected photon is generally substantially smaller than the capacitive output of the APDs.

Figure 6A:
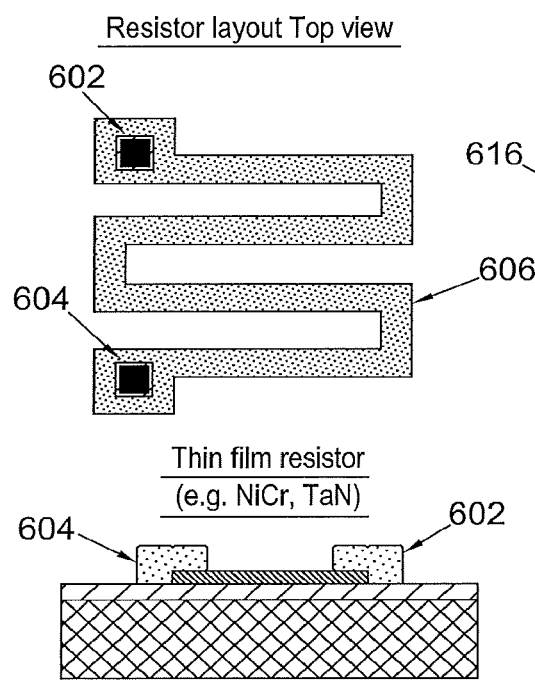
FIG. 6A shows an on-chip resistor.

FIG. 6A shows an on-chip resistor. The resistor comprises a thin film conductor 606 (for instance, NiCr or TaN) deposited between two metal contacts 602, 604. The resistance of the resistor is determined by the length (l), width (w), thickness (t) and type of metal used for the thin film:

$$R = \frac{R_{sh}l}{w}$$

wherein $R_{sh}$ is the sheet resistance for the given conductor. The sheet resistance is determined by the bulk resistivity (ρ) of the conductor and the thickness (t) of the film:

$$R_s = \frac{\rho}{t}$$

For instance, the sheet resistance for a NiCr film of 34 nm is 50 Ω/sq.

As the resistance increases with the length of the thin film, the thin film may be formed into a snaking "zig-zag" pattern to increase the length whilst keeping the cross-section of the device small.

Figure 6B:
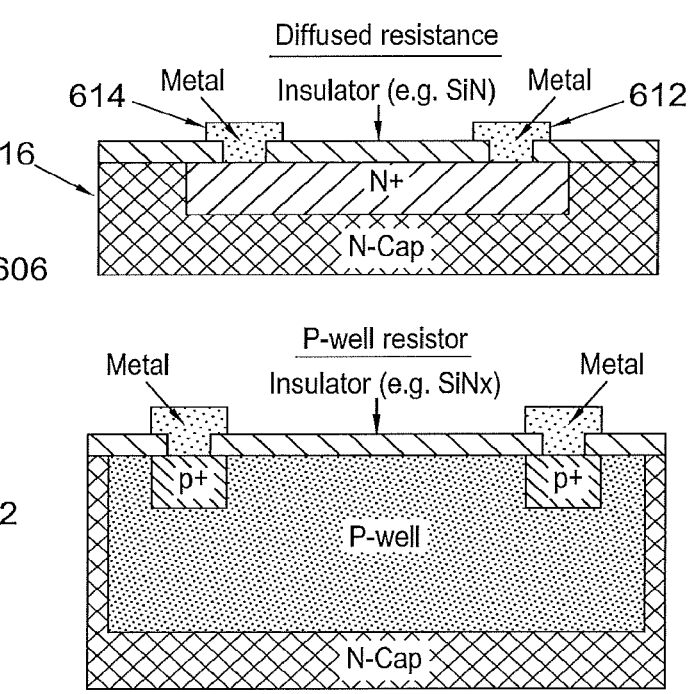
FIG. 6B shows two types of on-chip diffusion resistors.

FIG. 6B shows two types of on-chip diffused resistors. An n-type diffused resistor is shown above a p-type diffused resistor.

The n-type diffused resistor comprises two metal contacts 612, 614 deposited on an n+ doped region 616 of an n doped InP cap layer (N-cap). The two metal contacts 612, 614 are spaced apart from each other on the surface of the n+ doped region 616. An insulator (for instance, SiN) is deposited over the n+ doped region 616, between the metal contacts 612, 614. The resistance of a diffused resistor can be calculated in the same manner as for a thin film resistor, utilising the sheet resistance ($R_s$), length (l) and width (w) of the n+ doped region.

The p-well resistor is formed in the same manner as the n-type diffused resistor; however, a p-well is used, rather than an n+ doped region, and p+ doped regions are located below the metal contacts. The p+ doped regions have a higher doping concentration than the p-well.

FIG. 7A shows an on-chip capacitor. This on-chip capacitor utilises a metal plate 702 separated from a n+ or p+ doped semiconductor region 704 by an insulator (dielectric) 706. The insulator may be a nitride.

FIG. 7B shows an alternative on-chip capacitor. This capacitor is similar to the capacitor of FIG. 5A; however, the doped semiconductor region is replaced with a second metal plate embedded within the insulator.

In the arrangement of FIG. 5B the capacitance (C) is:

$$C = \varepsilon_0 \varepsilon_s \frac{lw}{d}$$

wherein l and w are the length and width of the metal plates respectively, d is the separation of the metal plates, $\varepsilon_0$ is the electric constant and $\varepsilon_s$ is the relative static permittivity of the dielectric between the metal plates.

For a capacitor with a nitride layer of 50 nm separating two square 40 μm×40 μm metal plates, the capacitance is 1 pF.

FIG. 7C shows a metallic spiral inductor suitable for on-chip implementation. The inductor comprises a metallic coil spiralling inwards upon itself on the surface of a substrate. At the centre, a via allows the inner end of the inductor to pass to a second level below the spiral to exit the spiral without forming a short circuit. The inductance is dependent on the width, spacing, inner diameter, outer diameter and number of turns in the spiral.

Figure 8:
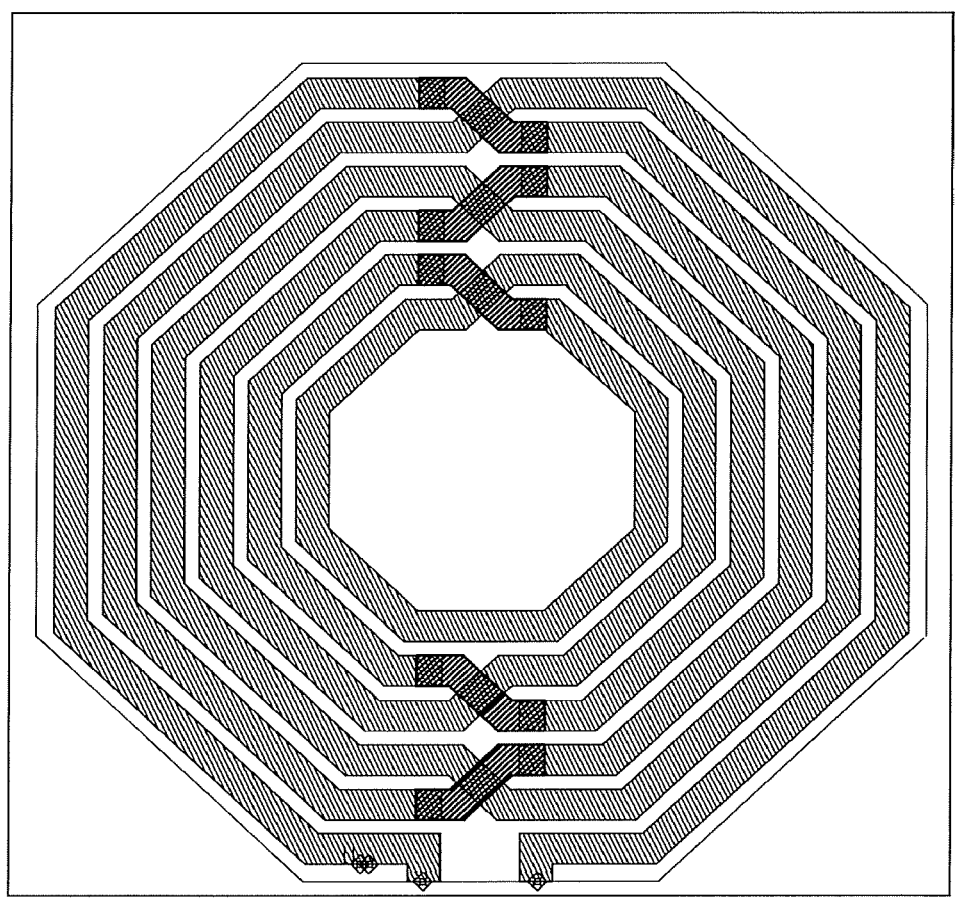
FIG. 8 shows another inductor suitable for on-chip implementation.

FIG. 8 shows another inductor suitable for on-chip implementation. In this arrangement, two conductor paths spiral inward from two contact points. The paths cross each other each half turn, moving inwards by one step. The paths can cross if one passes over the other, with an insulator separating the two paths. At the centre of the spiral the two paths join. The inductor is a spiral with six inward steps (N=6) and with a diameter (D) of 266 μm. This provides an inductance of 8 nH.

Figure 9:
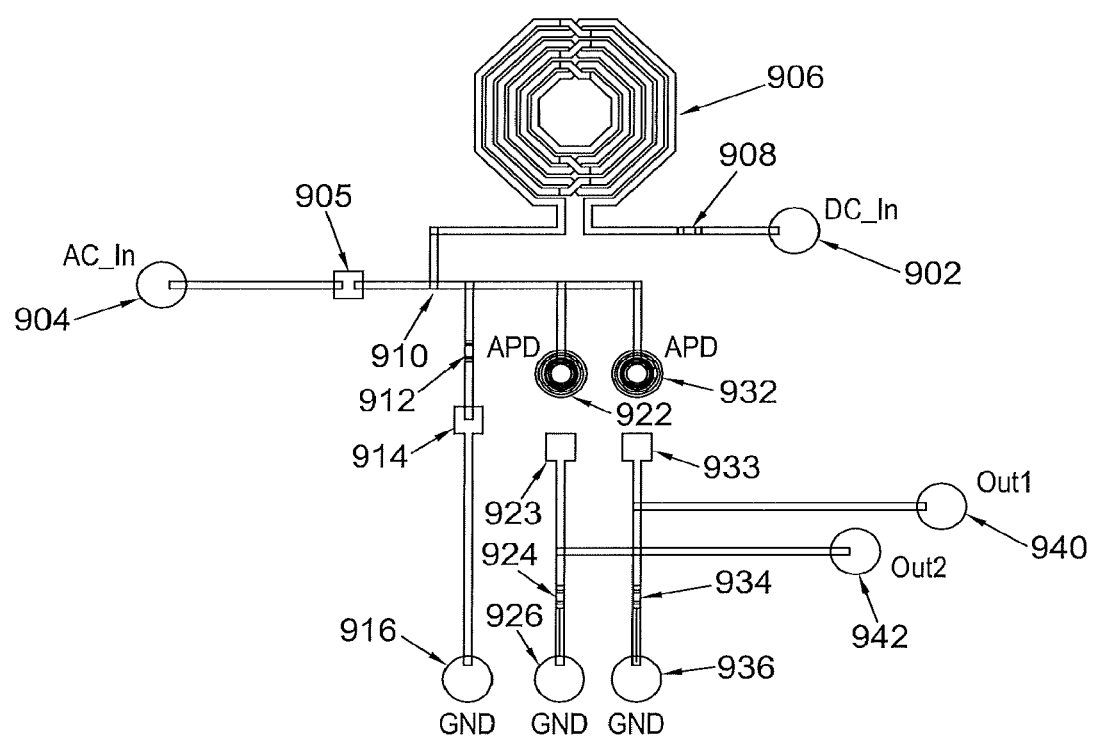
FIG. 9 shows an example of physical on-chip layout according to one arrangement.

FIG. 9 shows an example of physical on-chip layout according to one arrangement. The on-chip layout is similar to the arrangement of FIG. 2.

The circuit comprises a DC input terminal 902 and an AC input terminal 904. The DC input terminal 902 is connected to a first arm of a bias tee. The AC input terminal 904 is connected to a second arm of the bias tee. The first and second arms join at a node 910 which is connected to an output of the bias tee.

The first arm of the bias tee comprises an inductor 906 connected in series to a first resistor 908. The inductor 906 is connected to the node 910 whilst the first resistor 908 is connected to the DC input terminal 902. The second arm of the bias tee 910 comprises a first capacitor 905 connected between the AC input terminal 904 and the node 910.

The output of the bias tee is connected to three parallel paths. The first parallel path comprises a second resistor 912 connected to a first ground terminal 916 (GND) via a second capacitor 914. The second path comprises a first APD 922 connected to a second ground terminal 926 (GND) via a third resistor 924. The third parallel path comprises a second APD 932 connected to a third ground terminal 936 (GND) via a fourth resistor 934.

Portions of the connections between the APDs 922, 932 and the third 924 and fourth 934 resistors are hidden in FIG. 9 as they occur through a lower layer. Each APD 922, 932 has a respective via 923, 933 that passes through to a lower layer which provides a connection to the cathode of the respective APD. In this arrangement the bias voltage is provided by the bias tee to the anode of each APD 922, 932 and the output of each APD 922, 932 is taken from the cathode of each APD 922, 932. It will be appreciated that this arrangement can be reversed, if the bias voltage is reversed. Accordingly, as shall be discussed later, the bias voltage may be applied to the cathodes and the outputs may be taken from the anodes.

The output of the second APD 932 is also connected to a first output terminal 940 (Out1). The output of the first APD 922 is also connected to a second output terminal 942 (Out2)

One of the two APDs may function as a dummy APD to cancel out noise from signals detected in the other APD. In one arrangement, both APDs are able to detect photons, and one of the APDs is used as a dummy APD simply by not having light shone upon its detection region. In an alternative arrangement, only one of the APDs is configured to detect light, whilst the other is not configured to detect light. For instance, the dummy APD may have a light blocking layer placed over its detection region to prevent photons from reaching the detection region. Other than this, the two APDs are identical.

All of the components in FIG. 9 are deposited on a single chip in a single integrated circuit. The DC input 902 is configured to receive a DC input voltage. The AC input 904 is configured to receive an AC input voltage. The three ground terminals 916, 926, 936 are configured to be connected to ground. The first 940 and second 942 output terminals are configured to be connected to a subtractor circuit such as the one shown in FIG. 2.

The capacitors, resistors and inductor of FIG. 9 may be any of those shown in FIGS. 6A-8, or any alternative arrangements.

Figure 10:
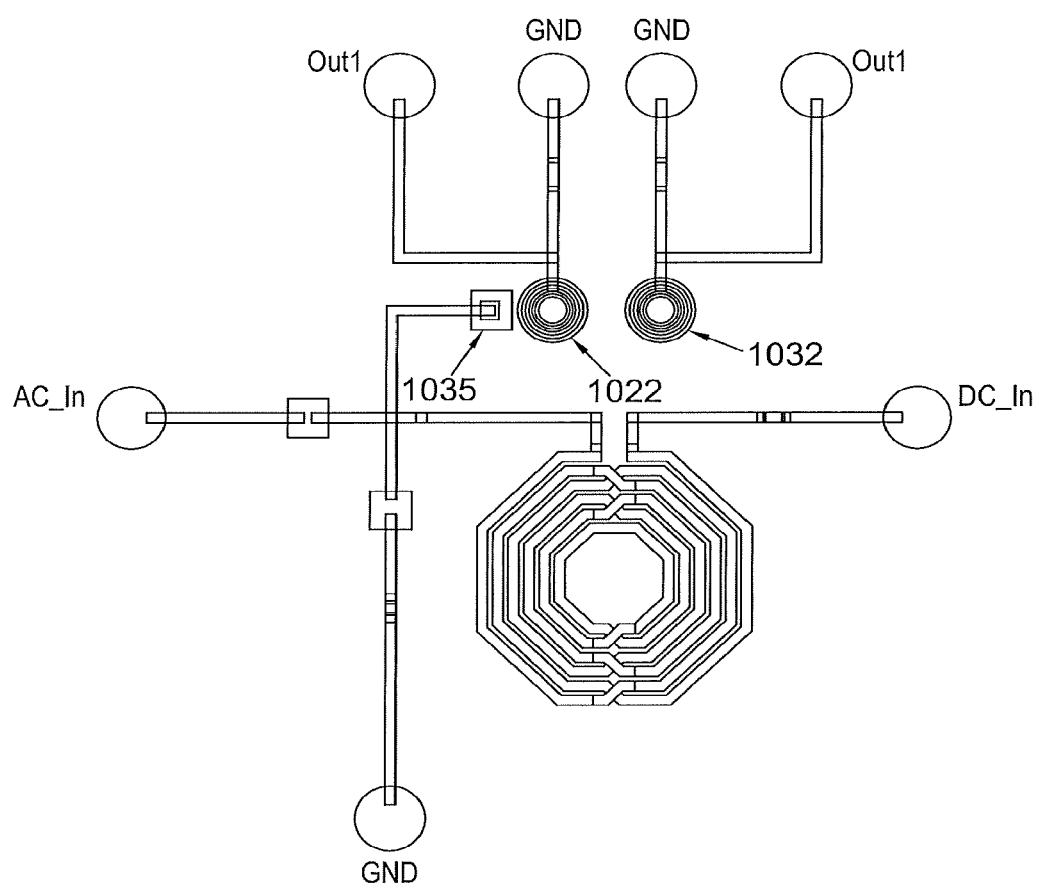
FIG. 10 shows an alternative arrangement to FIG. 9.

FIG. 10 shows an alternative arrangement to FIG. 9. This arrangement is similar to that of FIG. 9; however, the APDs 1022, 1032 are biased in reverse relative to the arrangement of FIG. 9. The output of each APD 1022, 1032 is taken from the anode of each APD 1022, 1032. The cathode of each APD 1022, 1032 is connected to the output of the bias tee. As the cathodes are located at a lower level, a vias 1035 is provided to connect the bias tee to the APDs 1022, 1032.

The arrangements of FIGS. 9 and 10 are drawn to scale. By fabricating the two APDs on the same chip, the two APDs can be formed simultaneously using the same doping and deposition steps.

Forming the bias tee and APDs on the same chip can help to greatly reduce the size of the photon detector and can help reduce noise in the system.

In FIG. 10, the first APD 922 is around 80 μm away from the node 910 of the bias tee. This means that the combined, filtered bias voltage does not travel far to the APDs, therefore reducing the amount of noise introduced into the bias voltage.

Figure 11:
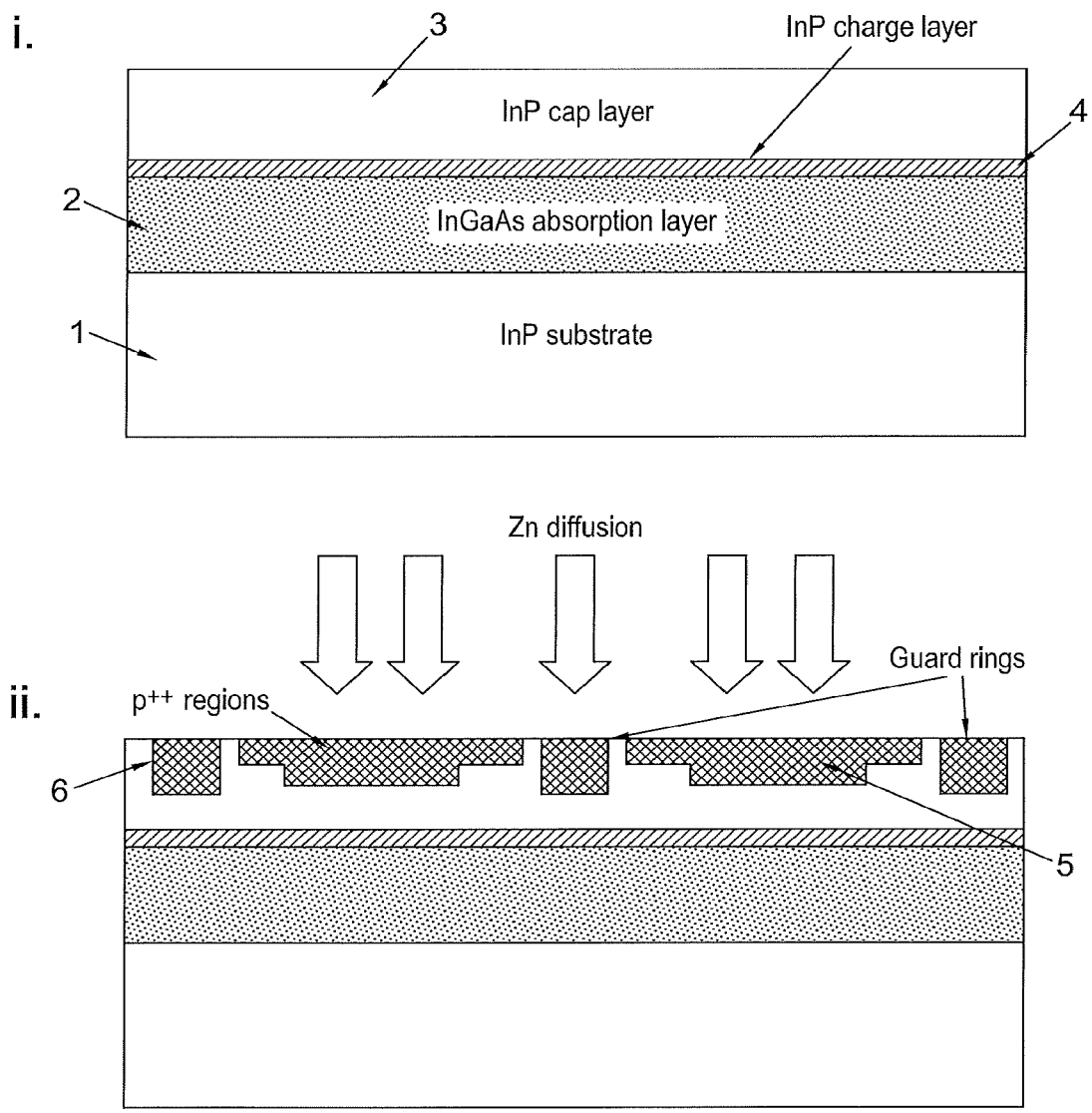
FIG. 11 shows initial steps in a fabrication sequence for producing a single photon detector.

In the arrangement of FIG. 10 the APDs are located around 35 μm away from each other. Forming the APDs in proximity to each other reduces the fabrication differences between the two APDs FIG. 11 shows initial steps in a fabrication sequence for producing a single photon detector. A schematic cross-sectional view the initial layers for producing the APDs in FIG. 10 is shown. The photon detection device may be fabricated using integrated circuit processing.

Two APDs are formed side-by-side. The cross-sectional view is taken along a plane passing horizontally across FIG. 10, in line with the via 1035.

The basis for the heterostructure is a substrate 1, on which the subsequent layer structure is fabricated. The substrate may be an InP substrate for example.

A uniform heterolayer, the second layer 2, is deposited on said substrate 1. The second layer 2 may be an un-doped or lightly doped n-type InGaAs layer for example.

A uniform n+ type heterolayer, the highly doped layer 4, is deposited on said second layer 2. This layer may be a highly doped n-type InP layer for example.

A uniform layer, the first layer 3 is deposited on said highly doped layer 4. The first layer 3 may be un-doped or lightly doped n-type InP for example.

A cross-sectional view of the device at this stage in fabrication is shown in i.

Areas of highly-doped p-type material 5 are incorporated into the first layer 3. The areas may be incorporated by Zn diffusion, or alternatively by gas immersion laser doping or ion implantation for example.

In an arrangement, further areas of highly doped material, forming the guard ring regions 6, are also incorporated into the first layer 3. The guard ring regions may be formed in the same step as the highly doped regions 5, or in a separate step, and by the same method or by a different method.

A cross-sectional view of the device at this stage in fabrication is shown in ii.

In an alternative arrangement, the first 3 and second 2 layers may be silicon, in which p-type and n-type doping may be achieved using Boron or Phosphorous impurities respectively. The device may alternatively be based on a Silicon-Germanium heterostructure or based on any of the III-V class of semiconductors.

In an alternative arrangement, the device comprises highly n-doped regions 5 which are incorporated into a moderately doped n-type heterolayer 3, for example by gas immersion laser doping, implantation or diffusion.

In general, each APD comprises a first layer 3 of a first conductivity type and a second layer 2 of the first conductivity type. These are lightly doped or even un-doped layers. The APD further comprises a highly doped layer 4 of the first conductivity type. The highly doped layer 4 is overlying and in contact with the second layer 2. The first layer 3 is overlying and in contact with the highly doped layer 4.

The first conductivity type is n-type and the second conductivity type is p-type. However, it will be appreciated that using alternative structures the first conductivity type can be p-type and the second conductivity type n-type.

The second layer 2 is overlying and in contact with a substrate 1. Alternatively, an intermediate layer or layers, such as a buffer layer, may be provided.

The first layer 3 comprises a highly doped region 5 of the second conductivity type for each APD. The highly doped regions 5 have a higher dopant concentration than the remainder of the first layer 3. These regions are "islands", i.e. each is laterally separated from the other high dopant concentration region(s) 5.

For the avoidance of doubt, the term "high dopant concentration region" refers to the concentration of the carriers donated by the dopant.

The highly doped regions 5 are located at the surface of the first layer 3. The depth of the highly doped regions is less than the depth of the first semiconductor layer 3.

The highly doped regions 5 have a circular shape seen in the plan view, in other words they have a cylindrical shape. The highly doped regions can in principle be any shape however, including polygonal and rounded. In this case, the highly doped regions have a portion having a smaller diameter and a portion having a larger diameter at the surface of the structure. This reduces edge breakdown.

The structure may also comprise guard rings 6. The guard rings 6 are arranged around the outside of the highly doped regions 5. In this case, the guard rings 6 are circular, however, they can in principle be any shape, including polygonal and rounded, with the overall geometry being matched to the shape of the highly doped regions 5. The guard rings 6 are also highly doped regions of the first layer 3 and are highly doped regions of the second conductivity type. The guard rings 6 have the same conductivity type as the highly doped regions 5. The guard rings 6 are located at the surface of the first layer 3. The depth of the guard rings 6 is less than the depth of the first semiconductor layer 3.

As shall be discussed later, a separate anode contact is connected to each metal contact region 8, such that each metal contact region, and thus each detection region, is connected to a separate anode. A single second metal contact region 10 is formed on the opposite side of the substrate 1 and is connected to a cathode.

In use, a p-i-n junction is formed from the highly doped p-type region 5, the n-type layer 3 and the highly doped n-type layer 4, forming an avalanche region.

A voltage is applied between each anode and the cathode. A high electric field is generated across the interface between the highly doped n-type layer 4 and each highly doped p-type layer 5. Avalanche multiplication can occur in this region when a suitable bias is applied across the junction.

The depth of the highly-doped layer 4 can be less than 0.1 μm such that a thin junction with a shallow depletion region is achieved, with the APD having a corresponding low breakdown voltage. The breakdown voltage will also depend on the doping level of the layer 4 and the doping level and depth of the region 5.

In an arrangement, the highly doped p-type regions 5 will have a doping concentration of at least $10^{16}$ cm$^{-3}$, in a further arrangement at least $10^{17}$ cm$^{-3}$ or $10^{18}$ cm$^{-3}$. In an arrangement, the doping concentration of the rest of the first layer 3 is at least a factor of 10 lower than that for the high field zones 5, in a further arrangement a factor of 100 lower. The doping level of the region 3 may be less than $10^{16}$ cm$^{-3}$ for example.

Figure 12:
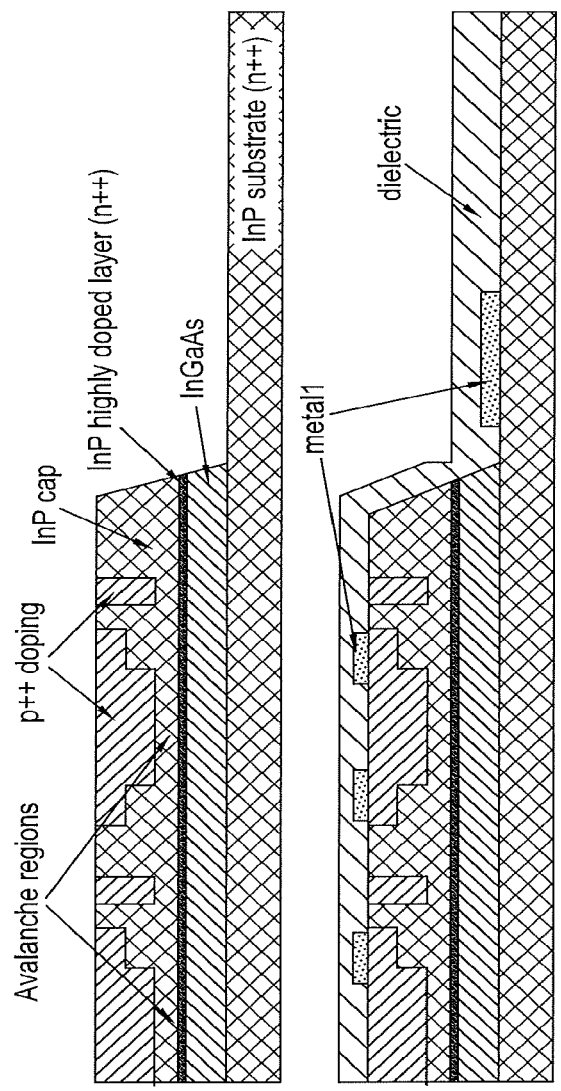
FIG. 12 shows third and fourth steps in the fabrication sequence of FIG. 11.

FIG. 12 shows third and fourth steps in the fabrication sequence of FIG. 11. In the present arrangement, the two APDs have been formed at the same time, with an InP cap being deposited on a highly doped (n++) InP layer. The highly doped InP layer has been formed on an InGaAs layer which has been deposited on an InP substrate, as discussed with regard to FIG. 11. Two detection regions and two guard rings, one surrounding each detection region, are formed via p++ doping, as discussed with regard FIG. 11. The InP cap layer includes an avalanche region under each detection region.

To create the connection between the cathodes of the APDs and the bias tee, a region adjacent to one of the APDs is etched down to the InP substrate (or kept clear using a mask). A metal contact is deposited onto the InP substrate, to form the connection between the bias tee and the APDs. This metal contact may be deposited at the same time as metal contacts (anodes) for the two APDs are deposited onto the surface of the p++ doped regions. A dielectric is then deposited over the whole area, covering the APDs, including the metal contacts.

Figure 13:
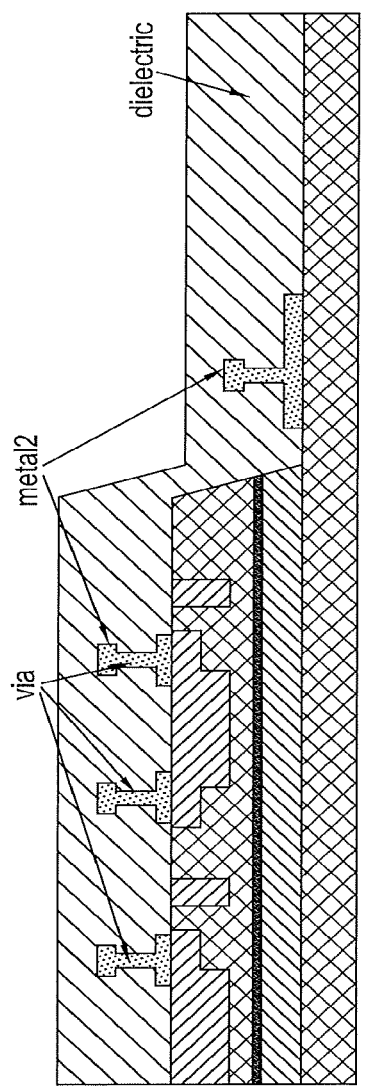
FIG. 13 shows a fifth step in the fabrication sequence of FIGS. 11 and 12.

The metal contact may be a Chromium/Gold double layer where the highly doped p-type regions are InP FIG. 13 shows a fifth step in the fabrication sequence of FIGS. 11 and 12. Vias are then formed within the dielectric, above each metal contact. These may be formed by introducing holes in the dielectric above each metal contact (via etching or masking) and depositing metal within the holes.

At the same time, a resistor thin film may be deposited adjacent to each APD to form the resistors that are connected to the outputs of the APDs. The lower layers for the resistors, capacitors and inductors may all be deposited at this time. An upper layer of dielectric is then deposited over the whole region (including the vias and the resistor).

Figure 14:
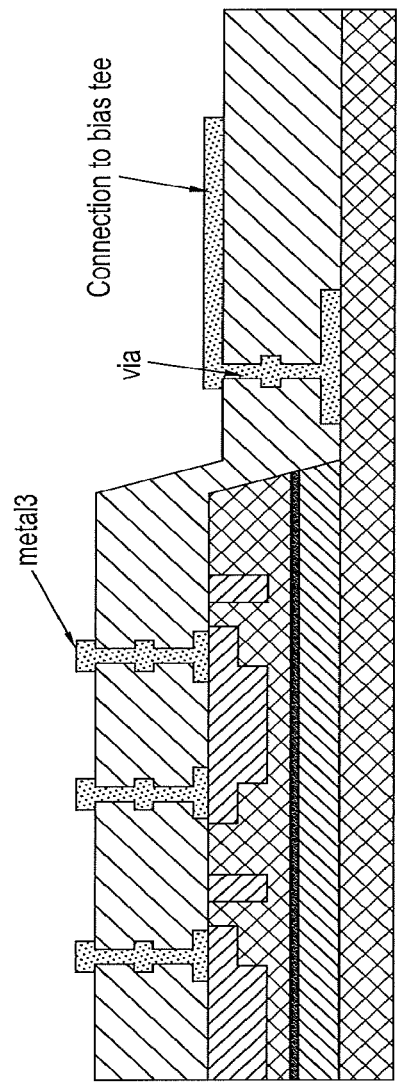
FIG. 14 shows a sixth step in the fabrication sequence of FIGS. 11-13.

FIG. 14 shows a sixth step in the fabrication sequence of FIGS. 11-13. Vias are formed in the upper layer of dielectric above each via. Vias may also be formed at the same time above each end of the resistor thin films, and in the capacitors and inductors in the circuit. The vias may be formed in the same way as discussed earlier. Metal contacts are deposited above the vias in the APDs which are then connected to the respective resistors to form the output of each APD. A connection is formed between the via connected to the InP substrate and the bias tee to allow the cathode of the APDs to be driven.

A metal connection is formed between the via above the metal contact in the resistor and the adjacent via above the resistor thin film. A metal connection may also be formed between from the via above the opposite end of the thin film, leading to ground. The connections between the circuit components may all be deposited at this point. These vias, metal contacts and metal connections may be deposited at the same time.

Figure 15:
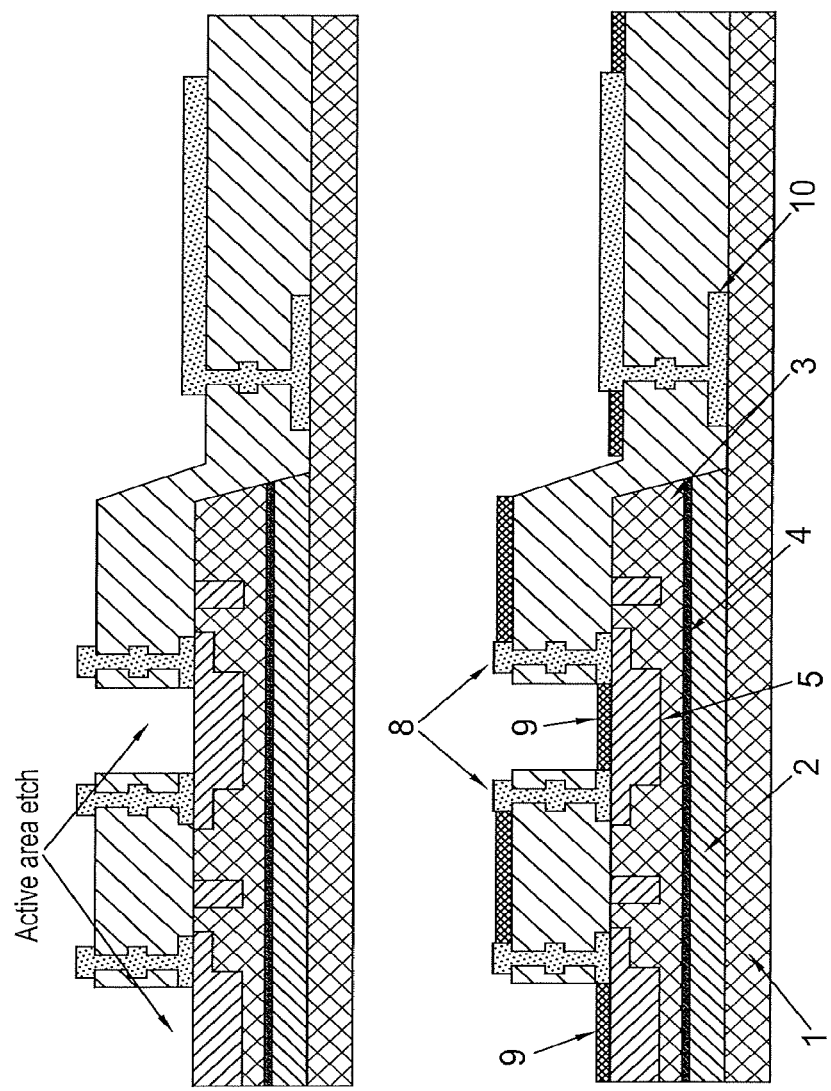
FIG. 15 shows two final steps of the fabrication sequence of FIGS. 11-14.

FIG. 15 shows two final steps of the fabrication sequence of FIGS. 11-14. The dielectric between the metal contacts in each APDs is etched away to expose the active areas of the APDs. Finally, an anti-reflective coating is deposited over the active areas. The anti-reflective coating may be deposited over the whole region, including the dielectric, provided that it does not cover any contact pads.

The material of the anti-reflective coating may depend on the wavelength of light intended for the detector. For example, for an InP based detector, silicon nitride with a selected thickness may be used so that the reflection at the surface is minimal.

The region in each APD between the metal contacts and covered in anti-reflective coating is the detection region.

Each APD may be operated in Geiger mode. In Geiger mode operation, a reverse voltage that exceeds the breakdown voltage is applied to the APD. Light incident on the surface of the device on which the anti-reflective coating 9 is coated, i.e. at the side of the substrate on which the layers are fabricated, is absorbed and generates carriers. The light is absorbed in the region 2, generating carriers which drift to region 3 to multiply in the high electric field regions due to impact ionisation. The high electric field across the interface between the highly doped n-type layer 4 and the highly doped p-type regions 5 means that avalanche multiplication occurs in these regions when a voltage above the breakdown voltage is applied across the junction. The generated carriers are thus multiplied in the avalanche multiplication region. The resultant output signal for each detection region, $V_{OUT}$, is measured at the corresponding anode contact 8. The detection regions comprise the regions between the metal contacts 8 and covered with the anti-reflective coating 9, from the highly doped region 5 down to the highly doped layer 4.

A time varying voltage is applied through the bias tee circuit. An AC voltage component $V_{AC}$ and a DC voltage component $V_{AC}$ are combined using the bias-tee circuit. The bias tee circuit is connected to the cathode contact of the APD, i.e. metal contact 10. The bias voltage applied to the APD thus comprises both a DC component and an AC component. The bias voltage applied to the APD is above the breakdown voltage at its highest values and below the breakdown voltage at its lowest values. When the bias voltage exceeds the breakdown voltage the detector is gated "on", when it is below the breakdown voltage the detector is gated "off".

In an arrangement, the output of the APD for each detection region is measured at a resistor which is connected to ground. Each anode contact 8 is connected to a resistor. When a photon is incident on the detection region, an avalanche photocurrent is induced, which leads to a voltage across the resistor corresponding to the output voltage, $V_{out}$. Other circuitry may be used to measure the electrical output of the detection regions.

Conversely, as discussed with regard to FIG. 9, the bias voltage may be reversed and applied to the anode contacts, with the output voltages being taken from each APD separately through the substrate 1. This would require an insulator to be formed in the substrate 1 between the two APDs.

Figure 16:
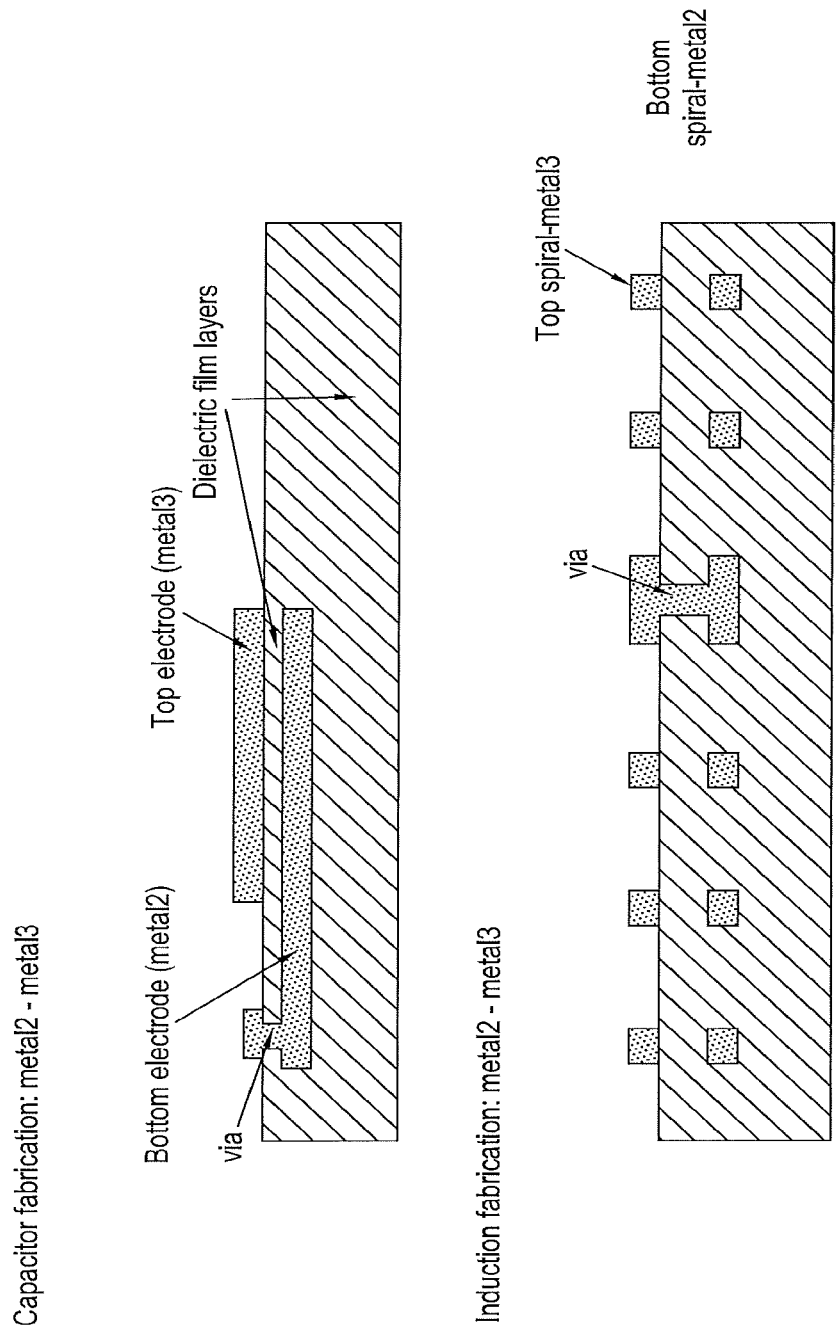
FIG. 16 shows cross-sectional views of a capacitor and an inductor.

FIG. 16 shows cross-sectional views of a capacitor and an inductor.

To form a capacitor, a bottom metal electrode is deposited on a first dielectric layer. A second dielectric layer is deposited over the bottom metal electrode and a via is formed in the second dielectric layer connecting to the bottom electrode. A top electrode is formed above the bottom electrode, on the second dielectric layer. The metal of the via and the top electrode may be deposited simultaneously.

To form an inductor, a bottom spiral of metal may be formed on a bottom dielectric layer. A top dielectric layer may be formed over the bottom spiral. Top spiral of metal may be formed over the top dielectric layer, above the bottom dielectric layer. A via may be formed to connect the top and bottom spirals. The metal of the via and the top spiral may be deposited simultaneously.

Figure 17:
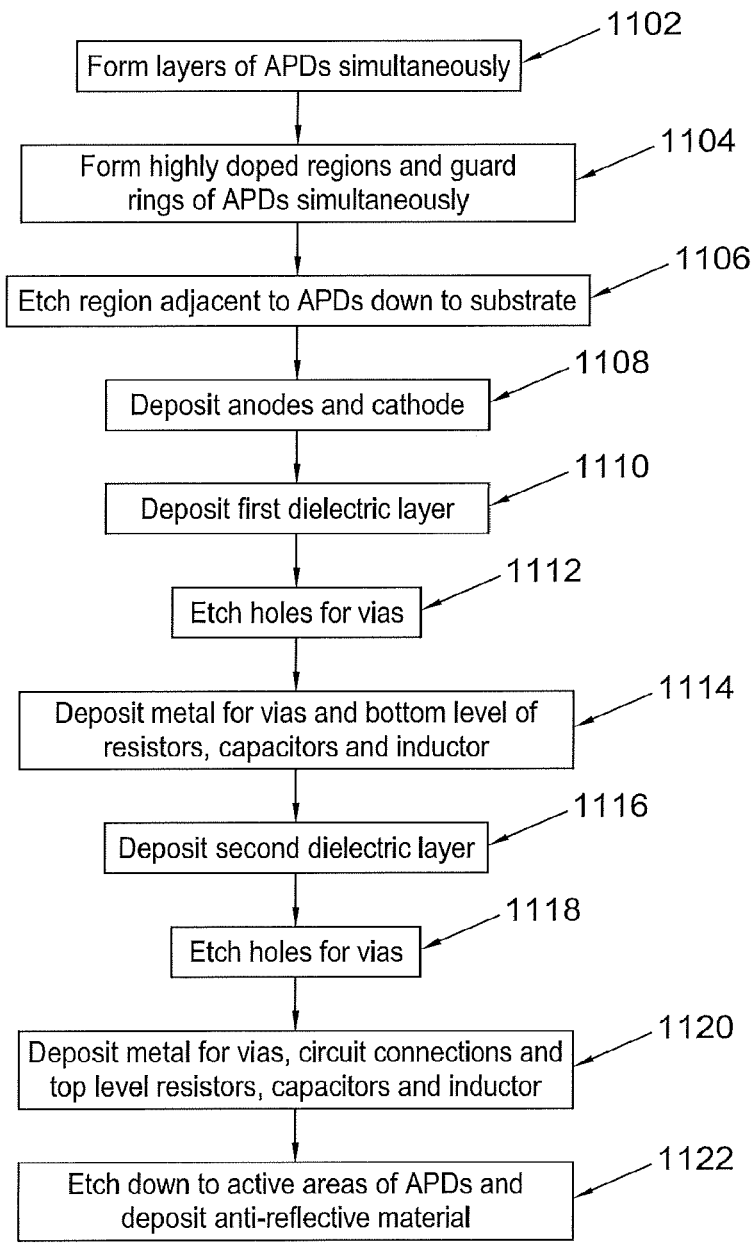
FIG. 17 shows a method for forming a single photon detector according to an arrangement.

FIG. 17 shows a method for forming a single photon detector according to an arrangement. The method details the steps discussed with regard to FIGS. 11-16.

Initially, the layers of the APDs are formed 1102 to produce the structure shown in the top of FIG. 11. The corresponding layers for both APDs may be formed at the same time. Then the highly doped region and guard ring for each APD is formed 1104 to produce the structure shown at the bottom of FIG. 11.

A region adjacent to the APDs is etched down to the substrate 1106 to form the structure shown in the top of FIG. 12. The anodes and cathodes are then deposited 1108. This may be performed in the same deposition step. The anodes for each APD are deposited onto the highly doped region of the APD. A single, joint cathode is deposited onto the substrate in the etched region to form the structure shown on the bottom of FIG. 12.

A first dielectric layer is then deposited over the APDs and the anodes and cathodes 1110. Holes are etched in the first dielectric layer down to the anodes and cathodes 1112.

The metal for the vias, and for the bottom level of the resistors, capacitors and inductor (the components shown in FIG. 10) is then deposited 1114. Again, this may be deposited in the same deposition step. This forms the resistor thin film for each resistor, the bottom spiral in the inductor and the bottom electrode in each capacitor in the circuit of FIG. 10, as well as filling the etched holes down to the anodes and cathodes.

A second dielectric layer is then deposited 1116 over the circuit (over the first dielectric layer and the inductor, resistors, capacitors, vias and APDs). Holes are etched for vias in the second dielectric layer 1118. This includes holes down to the vias in the first dielectric layer, as well as vias down to the bottom layers of resistors, capacitors and inductors.

The metal for the vias, the circuit connections shown in FIG. 10 and the top layers of the resistors, capacitors, and inductor are then deposited 1120. This can be performed in the same deposition step. This forms top electrodes of the capacitors and the top spiral of the inductor. This completes the connections down to the anodes, cathodes and resistors. This also forms the electrical links between the components.

Finally, the dielectric between the anodes of each APD is etched away to expose the active areas (top structure of FIG. 15) and the anti-reflective material is deposited over the active areas (bottom structure of FIG. 15) 1112.

A capping layer may be applied over one of the APDs to prevent it from detecting light. This ensures that this APD is the dummy APD. Alternatively, both APDs may be capable of detecting light; however, only one may be used at a time so that the other can act as the dummy APD.

By implementing the bias tee and APDs on the same substrate, the size of the detector can be greatly reduced and the speed and accuracy of the detector can be improved. In addition, by implementing two APDs, with one acting as a dummy APD, and forming them on the same chip, any fabrication differences between the two APDs can be minimized. This allows the dummy APD to more effectively cancel out the capacitive response of the active APD.

Whilst FIGS. 9-17 discuss various arrangements of components and methods of forming said components, it will be appreciated that each component may be formed via alternative means and arranged in different forms provided that they achieve their desired function. For instance, alternative materials for each APD may be used, with alternative or opposite doping properties, provided that the APDs are identical and each is able to detect a single photon incident on its active region (subject to any blocking layer that may be placed above the dummy APD). In addition, whilst the method of FIG. 17 discusses depositing some layers for different components at the same time, it will be appreciated that different deposition sequences may be utilised.

While certain arrangements have been described, the arrangements have been presented by way of example only, and are not intended to limit the scope of the inventions. Indeed, the novel methods and devices described herein may be embodied in a variety of other forms; furthermore, various omissions, substitutions and changes in the form of the methods and systems described herein may be made.

The invention claimed is:

1. A method for fabricating a photon detection device on a substrate, the method comprising:
    forming on the substrate a first single photon detector configured to register a detection signal based on only a single photon being incident on the first single photon detector and output the detection signal indicative of the detected photon;
    depositing simultaneously,
        an anode on the first single photon detector, and
        a cathode on the substrate at a region adjacent to the first single photon detector;
    depositing a first dielectric layer over the first single photon detector, the anode and the cathode and forming holes through the dielectric layer to the anode and the cathode;
    depositing simultaneously,
        vias through the holes in the first dielectric layer, and
        a bottom level of a bias tee, the bottom level comprising,
            a resistor thin film for a resistor,
            a bottom electrode for a capacitor, and
            a bottom level of an inductor;
    depositing a second dielectric layer over the first single photon detector, the vias and the bottom level of the bias tee;
    forming holes through the second dielectric layer to the vias in the first dielectric layer, opposite ends of the resistor thin film, the bottom electrode and the bottom level of the inductor;
    depositing simultaneously,
        vias through the holes in the second dielectric layer,
        a top level of the bias tee, the top level comprising,
            a top electrode for the capacitor,
            a top level of the inductor, and
            electrical connections for the bias tee, said electrical connections forming,
                a first input line connected to a first input terminal for receiving a DC input voltage, the first input line comprising a low pass filter comprising the inductor and the resistor,
                a second input line connected to a second input terminal for receiving an AC input voltage, the second input line comprising a high pass filter comprising the capacitor, an output of the bias tee for outputting a combination of the AC and DC voltages as a combined output, and a connection between the output of the bias tee and one of the cathode or the anode through the corresponding via to provide the combined voltage to the first single photon detector and a first output terminal connected to the other of the cathode or the anode through the corresponding via for outputting a detection signal from the single photon detector; and exposing an active area of the first single photon detector, wherein the photon detection device is formed in a single integrated circuit.

2. A method according to claim 1 further comprising:

forming on the substrate a second single photon detector connected to the output of the bias tee, in parallel to the first single photon detector, and configured to receive the combined voltage from the bias tee and output an output signal; and forming on the substrate a second output terminal connected to an output of the second single photon detector for outputting the output signal.

3. A method according to claim 2 wherein the first and second single photon detectors are identical.

4. A method according to claim 3 wherein the first and second single photon detectors are formed simultaneously.

5. A method according to claim 2 wherein the first and second single photon detectors are formed within 150 μm of each other.

* * * * *